(12) United States Patent
Guo et al.

(10) Patent No.: US 9,880,412 B2
(45) Date of Patent: Jan. 30, 2018

(54) DISPLAY PANEL AND DISPLAY METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Renwei Guo, Beijing (CN); Xue Dong, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 24 days.

(21) Appl. No.: 14/429,938

(22) PCT Filed: Jul. 25, 2014

(86) PCT No.: PCT/CN2014/083001
§ 371 (c)(1),
(2) Date: Mar. 20, 2015

(87) PCT Pub. No.: WO2015/109798
PCT Pub. Date: Jul. 30, 2015

(65) Prior Publication Data
US 2016/0041424 A1   Feb. 11, 2016

(30) Foreign Application Priority Data

Jan. 27, 2014   (CN) .......................... 2014 1 0041243

(51) Int. Cl.
*G02F 1/1335* (2006.01)
*G09G 3/20* (2006.01)
(Continued)

(52) U.S. Cl.
CPC ....... *G02F 1/133514* (2013.01); *G02B 5/201* (2013.01); *G09G 3/2003* (2013.01);
(Continued)

(58) Field of Classification Search
CPC ......... G09G 2300/0439; G09G 3/2074; G09G 3/3225; G09G 2300/0452;
(Continued)

(56) References Cited

U.S. PATENT DOCUMENTS

| | | | |
|---|---|---|---|
| 2009/0051638 A1* | 2/2009 | Horiuchi ............. | G09G 3/2003 345/88 |
| 2013/0027437 A1* | 1/2013 | Gu ...................... | G09G 3/3607 345/690 |
| 2014/0285542 A1* | 9/2014 | Izumi .................. | G09G 3/2003 345/694 |

FOREIGN PATENT DOCUMENTS

| | | |
|---|---|---|
| CN | 101336443 A | 12/2008 |
| CN | 103928496 A | 7/2014 |

OTHER PUBLICATIONS

International Application No. PCT/CN2014/083001, International Search Report dated Oct. 22, 2014, thirteen (13) pages.

* cited by examiner

*Primary Examiner* — Amare Mengistu
*Assistant Examiner* — Gloryvid Figueroa-Gibson
(74) *Attorney, Agent, or Firm* — Nath, Goldberg & Meyer; Joshua B. Goldberg

(57) ABSTRACT

The present invention provides a display panel and a display method thereof, and a display device. The display panel comprises a plurality of pixel units, each pixel unit is composed of nine sub-pixels arranged in five columns, one center sub-pixel traversing two rows is only provided in the third column of each pixel unit, while the sub-pixels are arranged in two rows in other columns. The nine sub-pixels
(Continued)

in each pixel unit include color sub-pixels and compensation sub-pixels, the color sub-pixels include a red sub-pixel, a green sub-pixel and a blue sub-pixel, and the compensation sub-pixels include a brightness compensation sub-pixel and a chromaticity compensation sub-pixel. The center sub-pixel has any one of five kinds of colors, a number of the sub-pixels with each of other four colors is two, and the sub-pixels with the same color are not adjacent to each other.

8 Claims, 6 Drawing Sheets

(51) Int. Cl.
    *H01L 27/32*     (2006.01)
    *G02B 5/20*     (2006.01)
    *G09G 3/3225*     (2016.01)
    *G09G 3/3208*     (2016.01)

(52) U.S. Cl.
    CPC ....... *G09G 3/3225* (2013.01); *H01L 27/3213* (2013.01); *H01L 27/3216* (2013.01); *H01L 27/3218* (2013.01); *G02F 2201/52* (2013.01); *G09G 3/3208* (2013.01); *G09G 2300/0452* (2013.01); *G09G 2320/0666* (2013.01); *G09G 2340/0457* (2013.01)

(58) Field of Classification Search
    CPC ... G09G 2320/0666; G09G 2340/0457; G09G 3/3208; G09G 3/2003; G02B 5/201; H01L 27/3218; H01L 27/3211; H01L 27/3213; H01L 27/14603; H01L 27/3216; G02F 1/133514; G02F 2201/52; G02F 1/134336; G02F 2001/134345
    USPC ...... 345/3.3, 149, 152, 694–698; 3/3.3, 149, 3/152, 694–698
    See application file for complete search history.

DISPLAY PANEL AND DISPLAY METHOD THEREOF, AND DISPLAY DEVICE

CROSS-REFERENCE TO RELATED APPLICATION

This is a National Phase Application filed under 35 U.S.C. 371 as a national stage of PCT/CN2014/083001, filed Jul. 25, 2014, and claims priority benefit from Chinese Application No. 201410041243.X, filed Jan. 27, 2014, the content of each of which is hereby incorporated by reference in its entirety.

FIELD OF THE INVENTION

The present invention relates to the field of display technology, and in particular, relates to a display panel and a display method thereof and a display device.

BACKGROUND OF THE INVENTION

In a conventional liquid crystal display device or organic light emitting diode (OLED) display device, each point (pixel) displays colors by a plurality of sub-pixels through light mixing, e.g. each pixel is composed of a red sub-pixel, a green sub-pixel and a blue sub-pixel (i.e., in RGB mode).

To improve the visual effect, the requirement for resolution (the number of pixels in a unit size) of a display device is increasingly high, this requires increasingly small size of the sub-pixels, but the size of the sub-pixels cannot be infinitely reduced due to process limitation.

To improve the display effect under the condition that the size of the sub-pixels is definite, a display device of a Pentile mode is proposed. In the display device of the Pentile mode, the number of sub-pixels of part of colors (e.g. red sub-pixels and blue sub-pixels) is halved, meanwhile, in the display device, the sub-pixels of different colors are virtualized as in different "layers", each layer is divided into a plurality of sampling areas, the divided sampling areas of each layer are not superposed, and then the content to be displayed by each sub-pixel is calculated by using an area ratio of the sampling areas. A part of the sub-pixels in the display device of the Pentile mode are "shared", so that a resolution higher than the practical resolution is achieved on the visual effect.

However, the display effect of the existing display device of the Pentile mode is still not ideal. Since the number of the sub-pixels of part of colors is halved, the sub-pixels of various colors are not uniformly distributed, and the problems of serrated grains, latticed spots, unclear display of small contents and the like are easily caused. Meanwhile, due to a calculation mode of "layer and region divisions", a complex calculation process is needed for calculating the content which needs to be displayed by each sub-pixel, and the calculation quantity is large.

SUMMARY OF THE INVENTION

For solving the technical problems of poor display effect and large calculation quantity in the existing high-resolution display technology, the present invention provides a display panel and a display method thereof and a display device with high resolution, good display effect and small required calculation quantity.

According to an aspect of the present invention, there is provided a display panel comprising a plurality of pixel units, each pixel unit is composed of nine sub-pixels arranged in five columns, one center sub-pixel traversing two rows is only provided in the third column of each pixel unit, while the sub-pixels are arranged in two rows in other columns. The nine sub-pixels in each pixel unit include color sub-pixels and compensation sub-pixels, the color sub-pixels include a red sub-pixel, a green sub-pixel and a blue sub-pixel, and the compensation sub-pixels include a brightness compensation sub-pixel and a chromaticity compensation sub-pixel. The center sub-pixel has any one of five kinds of colors, a number of the sub-pixels with each of other four colors is two, and the sub-pixels with the same color are not adjacent to each other.

In the display panel, the above-mentioned "row" and "column" are for a matrix composed of a plurality of sub-pixels, the sub-pixels are arranged in a plurality of parallel straight lines along both the "row direction" and the "column direction", and the "row" is perpendicular to the "column". Accordingly, the "row" and the "column" only indicate two opposite directions, and are irrelevant with the shape (rectangular, circular or special-shaped) of the sub-pixels, the placement manner (placed vertically, placed horizontally, upright, inverted or the like) of the display panel and the arrangement modes of a gate line and a data line. For example, each line of sub-pixels parallel to the gate line may be considered as a "row", or each line of sub-pixels parallel to the data line may be considered as a "row". Further, for example, when a display panel is placed normally, each line of sub-pixels parallel to the ground may be considered as a "row", or each line of sub-pixels perpendicular to the ground may be considered as a "row".

The brightness compensation sub-pixel may be a white sub-pixel, the chromaticity compensation sub-pixel may be a yellow sub-pixel or a cyan sub-pixel.

In the pixel unit, from the first column to the fifth column, an arrangement mode of the sub-pixels of each column in a column direction may be any one of the following fifteen modes: 1) R and G; Y and B; X; G and Y; B and R; 2) G and Y; R and B; X; B and G; Y and R; 3) R and Y; G and B; X; B and Y; G and R; 4) R and G; X and B; Y; G and X; B and R; 5) R and X; G and B; Y; B and G; X and R; 6) B and R; X and G; Y; B and X; B and G; 7) X and G; Y and B; R; G and Y; B and X; 8) G and X; Y and B; R; G and Y; B and X; 9) B and G; Y and X; R; X and Y; B and G; 10) X and R; Y and B; G; B and Y; G and X; 11) R and X; Y and B; G; X and R; B and Y; 12) R and B; Y and X; G; X and Y; B and R; 13) Y and G; X and R; B; G and X; R and Y; 14) R and X; Y and G; B; G and X; Y and R; and 15) R and G; X and Y; B; Y and X; G and R, wherein R indicates the red sub-pixel, G indicates the green sub-pixel, B indicates the blue sub-pixel, one of X and Y indicates the brightness compensation sub-pixel, and the other one indicates the chromaticity compensation sub-pixel.

The plurality of pixel units in the display panel may be repeatedly arranged row by row and column by column, so that the pixel unit, as a repeating unit, is arranged throughout the display panel.

The plurality of pixel units in the display panel may be repeatedly arranged row by row, and in two adjacent pixel units in a column direction in the display panel, a row direction coordinate of the former center sub-pixel is smaller than that of the latter center sub-pixel by one sub-pixel coordinate.

The display panel may be an organic light emitting diode display panel, each sub-pixel comprises a light emitting unit, and colors of light emitted by the light emitting units correspond to colors of the three color sub-pixels and the two compensation sub-pixels.

The display panel may be a liquid crystal display panel, each sub-pixel comprises a filter unit, and colors of light penetrating through the filter units correspond to colors of the three color sub-pixels and the two compensation sub-pixels.

According to another aspect of the present invention, there is provided a display device, comprising the above display panel.

In the display panel and the display device of the present invention, the sub-pixels of each color are uniformly distributed, so that serrated grains, latticed spots and the like are not produced. Meanwhile, the sub-pixels of each color are arranged in a specific manner, so that a higher resolution may be realized on the visual effect, and the calculation quantity required in the display process is small. In addition, two different compensation sub-pixels are comprised, so that the brightness and chromaticity compensations may be performed, and a better display effect is achieved.

According to yet another aspect of the present invention, there is provided a display method of the above display panel, comprising steps of: displaying a required color component of red, green or blue at each sub-pixel position, wherein this step comprises causing a plurality of color sub-pixels with the same color near a sub-pixel position to display, so that the required color component is displayed at the sub-pixel position under an average effect of the color sub-pixels with the same color; and performing display compensation on each sub-pixel position, wherein this step comprises performing display compensation on a sub-pixel position by using a plurality of compensation sub-pixels with a required color near the sub-pixel position.

In the display method, when a color component identical to the sub-pixel color of a sub-pixel position needs to be displayed at the sub-pixel position, the plurality of color sub-pixels with the same color near the sub-pixel position include a color sub-pixel at the sub-pixel position and a plurality of color sub-pixels with the color around the sub-pixel position; and when a color component different from the sub-pixel color of a sub-pixel position needs to be displayed at the sub-pixel position, the plurality of color sub-pixels with the same color near the sub-pixel position include a plurality of color sub-pixels with a required color around the sub-pixel position. When a color component identical to the sub-pixel color of a sub-pixel position needs to be displayed at the sub-pixel position, the plurality of color sub-pixels with the color around the sub-pixel position may include: two color sub-pixels with the color in the column of the sub-pixel position and closest to the sub-pixel position; and six color sub-pixels with the color respectively in columns on two sides of the column of the sub-pixel position and closest to the sub-pixel position.

When a color component different from the sub-pixel color of a sub-pixel position needs to be displayed at the sub-pixel position, the plurality of color sub-pixels with a required color around the sub-pixel position may include: four color sub-pixels with the required color in columns on two sides of the column of the sub-pixel position and closest to the sub-pixel position.

In addition, when a color component different from the sub-pixel color of a sub-pixel position needs to be displayed at the sub-pixel position, the plurality of color sub-pixels with a required color around the sub-pixel position may include: one color sub-pixel with the required color in the same row as the sub-pixel position and in a column having an interval of two columns to the column of the sub-pixel position in the row direction; and two color sub-pixels with the required color in two rows adjacent to the row of the sub-pixel position and closest to the sub-pixel position in the row direction.

In the display method, when a sub-pixel position needs display compensation and the compensation sub-pixels for compensation have a color the same as that of the sub-pixel at the sub-pixel position, the plurality of compensation sub-pixels with a required color near the sub-pixel position include a compensation sub-pixel at the sub-pixel position and a plurality of compensation sub-pixels with the color around the sub-pixel position; and when a sub-pixel position needs display compensation and the compensation sub-pixels for compensation have a color different from that of the sub-pixel at the sub-pixel position, the plurality of compensation sub-pixels with a required color near the sub-pixel position include a plurality of compensation sub-pixels with the required color around the sub-pixel position.

When a sub-pixel position needs display compensation and the color of the compensation sub-pixels for compensation is the same as the color of the sub-pixel at the sub-pixel position, the plurality of compensation sub-pixels with the color around the sub-pixel position may include: two compensation sub-pixels with the color in the column of the sub-pixel position, on upper and lower sides of the row of the sub-pixel position and closest to the sub-pixel position; and three compensation sub-pixels with the color in a column on a side of the column of the sub-pixel position and closest to the sub-pixel position.

When a sub-pixel position needs display compensation and the color of the compensation sub-pixels for compensation is different from the color of the sub-pixel at the sub-pixel position, the plurality of compensation sub-pixels with the required color around the sub-pixel position may include: two compensation sub-pixels with the required color in the same column as the sub-pixel position and closest to the sub-pixel position; and two compensation sub-pixels with the required color in a column on a side of the column of the sub-pixel position and closest to the sub-pixel position.

In addition, when a sub-pixel position needs display compensation and the color of the compensation sub-pixels for compensation is different from the color of the sub-pixel at the sub-pixel position, the plurality of compensation sub-pixels with the required color around the sub-pixel position may include: two compensation sub-pixels with the required color in the same column as the sub-pixel position and closest to the sub-pixel position; and one compensation sub-pixel with the required color in a column on a side of the column of the sub-pixel position, in the same row as the sub-pixel position and closest to the sub-pixel position.

In the display method of the present invention, any of all color components of red, green and blue may be displayed at each sub-pixel position (e.g. a blue component may be displayed at a red sub-pixel position by blue sub-pixels near the red sub-pixel position), i.e., a complete content may be displayed at each sub-pixel position, which is equivalent to a pixel, and thus the resolution on the visual effect is greatly improved. Moreover, the content displayed at each sub-pixel position is an average result of a plurality of sub-pixels near the sub-pixel position, and thus the displayed color is uniform and soft and the display effect is good. In addition, each sub-pixel position is used as a unit for displaying, and the contents which need to be displayed by the sub-pixels near the sub-pixel position are correspondingly calculated, so that complex calculation of "divisions of layer and region" is not needed, the calculation quantity is small, and the method is easy to be implemented. Meanwhile, due to the two different compensation sub-pixels, the brightness and chromaticity compensations may be performed, and a better display effect is achieved.

BRIEF DESCRIPTION OF THE DRAWINGS

FIG. 1 is a schematic diagram of a sub-pixel arrangement mode of a display panel of an embodiment of the present invention.

FIG. 2 is a schematic diagram of sub-pixel arrangement modes in fifteen sub-pixel units of a display panel of an embodiment of the present invention.

FIG. 3 is a schematic diagram illustrating a surrounding sub-pixel distribution mode of a sub-pixel arrangement mode in a display panel of an embodiment of the present invention.

FIG. 4 is a schematic diagram illustrating another surrounding sub-pixel distribution mode of a sub-pixel arrangement mode in a display panel of an embodiment of the present invention.

FIG. 5 is a schematic diagram illustrating another surrounding sub-pixel distribution mode of a sub-pixel arrangement mode in a display panel of an embodiment of the present invention.

FIG. 6 is a schematic diagram illustrating another surrounding sub-pixel distribution mode of a sub-pixel arrangement mode in a display panel of an embodiment of the present invention.

FIG. 7 is a schematic diagram illustrating a surrounding sub-pixel distribution mode of a sub-pixel arrangement mode in a display panel of an embodiment of the present invention.

FIG. 8 is a schematic diagram illustrating another surrounding sub-pixel distribution mode of a sub-pixel arrangement mode in a display panel of an embodiment of the present invention.

FIG. 9 is a schematic diagram illustrating another surrounding sub-pixel distribution mode of a sub-pixel arrangement mode in a display panel of an embodiment of the present invention.

FIG. 10 is a schematic diagram illustrating another surrounding sub-pixel distribution mode of a sub-pixel arrangement mode in a display panel of an embodiment of the present invention.

FIG. 11 is a schematic diagram illustrating another surrounding sub-pixel distribution mode of a sub-pixel arrangement mode in a display panel of an embodiment of the present invention.

FIG. 12 is a schematic diagram illustrating another surrounding sub-pixel distribution mode of a sub-pixel arrangement mode in a display panel of an embodiment of the present invention.

DESCRIPTION OF THE PREFERRED EMBODIMENT

To make those skilled in the art better understand the technical solutions of the present invention, the present invention will be further described in detail below in combination with the accompanying drawings and specific implementations. In the embodiments and drawings of the present invention, for ease of description, X indicates a brightness compensation sub-pixel, and Y indicates a chromaticity compensation sub-pixel. Actually, X and Y are only required to indicate different compensation sub-pixels, respectively, i.e., Y may indicate a brightness compensation sub-pixel, and X may indicate a chromaticity compensation sub-pixel.

Figures 1, 2:
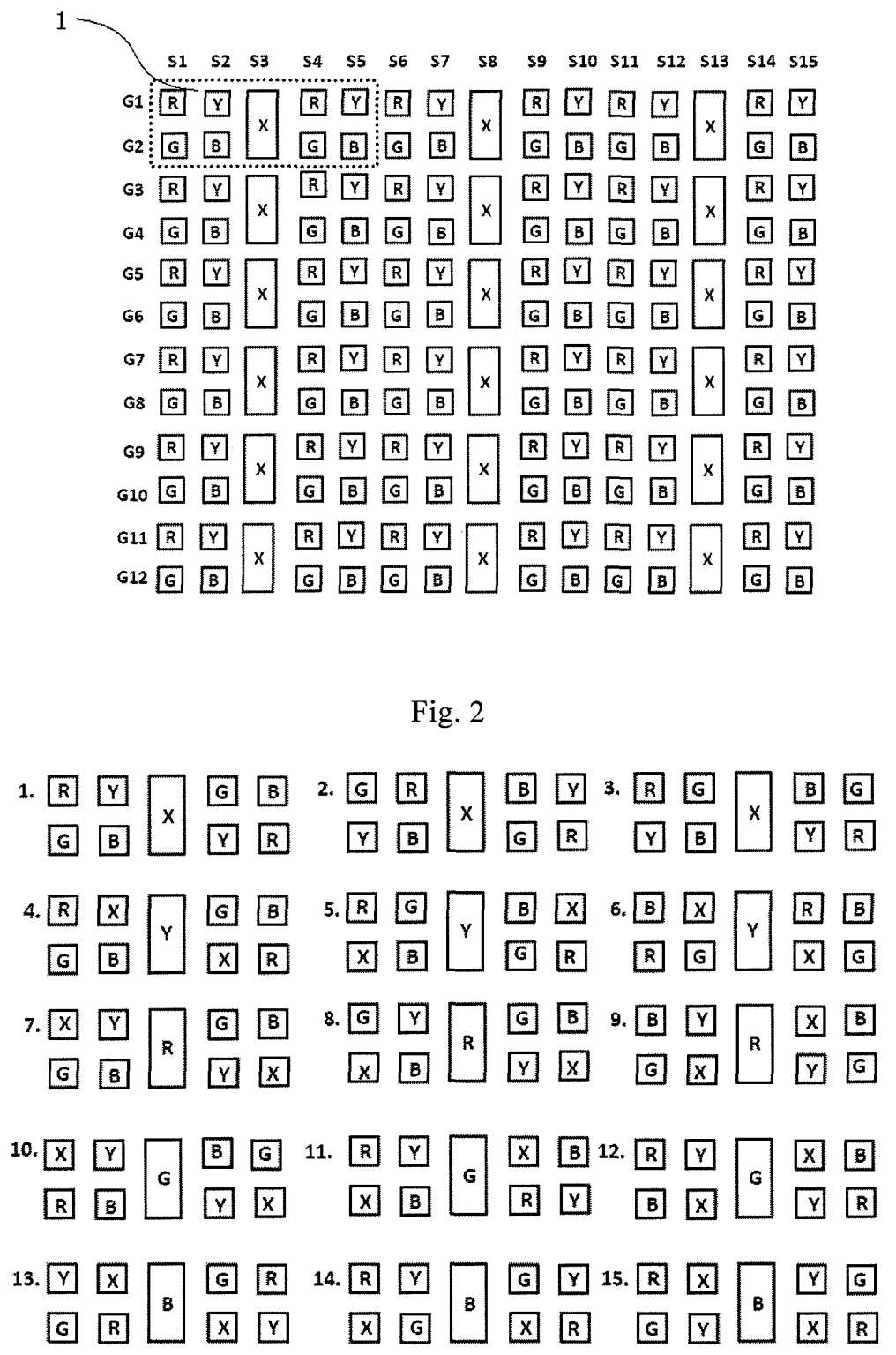

As shown in FIG. 1, a display panel of an embodiment of the present invention comprises a plurality of pixel units 1, each of which is composed of nine sub-pixels arranged in five columns. One center sub-pixel is only provided in the third column of each pixel unit 1, while the sub-pixels are arranged in two rows in other columns, and the center sub-pixel traverses two rows. The nine sub-pixels in each pixel unit 1 include sub-pixels with five kinds of colors, i.e., color sub-pixels with three kinds of colors and compensation sub-pixels with two kinds of colors. The color sub-pixels with the three kinds of colors include a red sub-pixel, a green sub-pixel and a blue sub-pixel, and the compensation sub-pixels with the two kinds of colors include a brightness compensation sub-pixel and a chromaticity compensation sub-pixel. The center sub-pixel has any one of the five kinds of colors, a number of the sub-pixels with each of other colors is two, and the sub-pixels with the same color are not adjacent to each other.

Specifically, as shown in the first through sixth kinds of pixel units of FIG. 2, the nine sub-pixels of the pixel unit include six color sub-pixels and three compensation sub-pixels, and the center sub-pixel is the compensation sub-pixel. The six color sub-pixels include two red sub-pixels, two green sub-pixels and two blue sub-pixels. The three compensation sub-pixels include one brightness compensation sub-pixel and two chromaticity compensation sub-pixels, or include two brightness compensation sub-pixels and one chromaticity compensation sub-pixel. In addition, as shown in the seventh through fifteenth kinds of pixel units of FIG. 2, the nine sub-pixels of each pixel unit 1 include five color sub-pixels and four compensation sub-pixels, and the center sub-pixel is the color sub-pixel. The five color sub-pixels include a red sub-pixel, a green sub-pixel and a blue sub-pixel, each number of the color sub-pixels with any two of the colors is two, and a number of the color sub-pixel with the remaining one color is one. The four compensation sub-pixels include two brightness compensation sub-pixels and two chromaticity compensation sub-pixels. As shown in FIG. 2, the sub-pixels with the same color are not adjacent to each other.

That is to say, the display panel of the embodiment comprises five kinds of sub-pixels, i.e., three kinds of red, green and blue color sub-pixels for displaying required color components and the brightness compensation sub-pixel X and the chromaticity compensation sub-pixel Y for display compensation. Different from the conventional display panel in which one pixel unit 1 is composed of five sub-pixels, in the display panel of the embodiment, one pixel unit 1 is composed of nine sub-pixels and then a plurality of pixel units 1 are arranged into a matrix to finally form the display panel. That is to say, each pixel unit 1 (comprising nine sub-pixels) may be regarded as a "point", and the "points" are arranged into a matrix.

For example, the plurality of the pixel units are repeatedly arranged row by row, and the plurality of the pixel units are repeatedly arranged column by column, so that the pixel unit, as a repeating unit, is arranged throughout the display panel.

In the display panel of the embodiment, the sub-pixels of each color are uniformly distributed, so that serrated grains, latticed spots and the like are not produced. Meanwhile, the sub-pixels of each color are arranged in a specific manner, so that a higher resolution may be realized on the visual effect, and the calculation quantity in the display process is small. In addition, two kinds of compensation sub-pixels are comprised, so that the brightness compensation and the chromaticity compensation may be performed simultaneously, and the display effect is good.

Figures 3, 4:
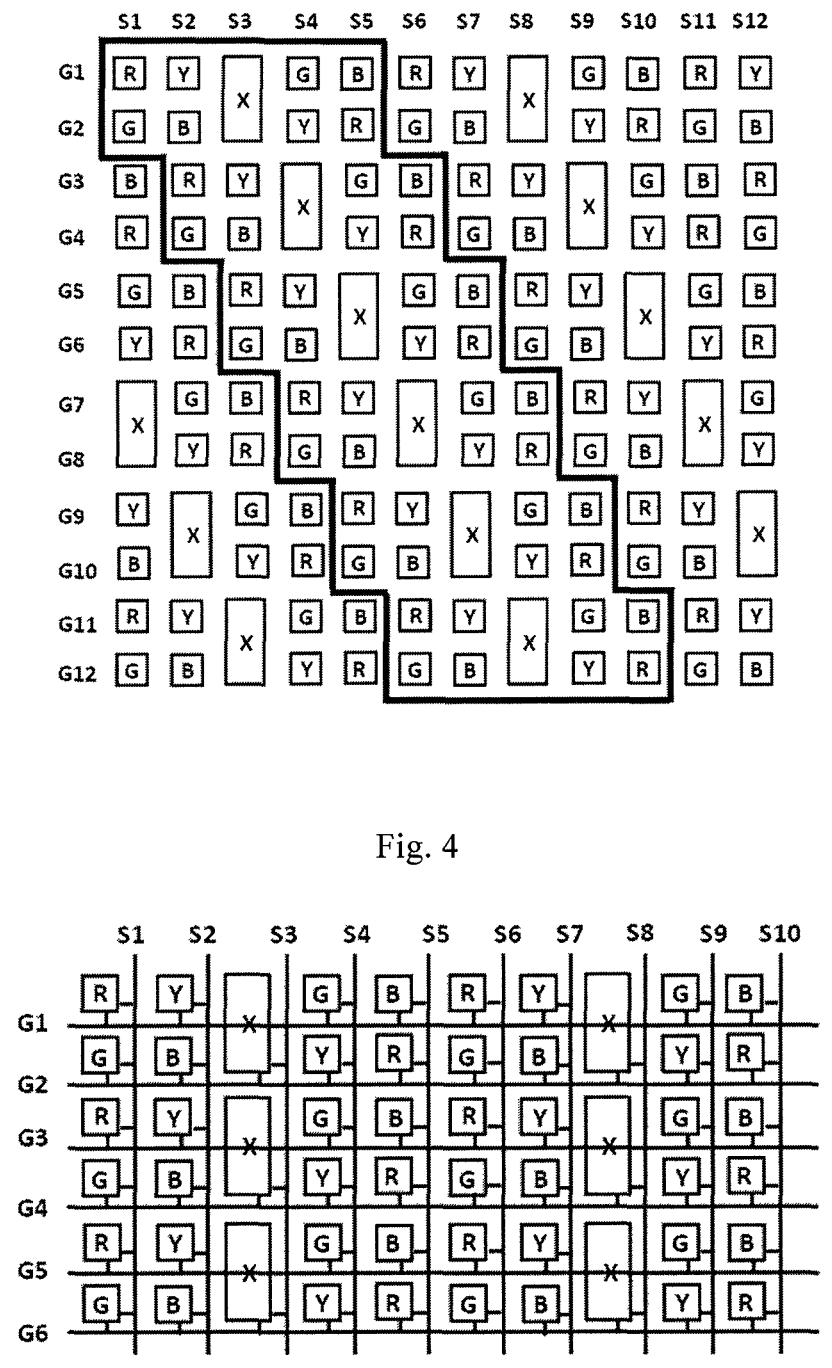

For example, as shown in FIG. 3, in two adjacent pixel units 1 in the column direction in the display panel of the embodiment, a row direction coordinate of the former center sub-pixel (e.g., $S_n$) is smaller than that of the latter center sub-pixel (e.g., $S_{n+1}$) by one sub-pixel coordinate. That is, the center sub-pixels are arranged obliquely and in a manner of misalignment, rather than in shape of vertical strips, which has an advantage of more uniform output of compensation colors.

For example, a sub-pixel arrangement mode in the pixel unit 1 may be any one of fifteen kinds shown in FIG. 3. Researches discover that, the fifteen kinds of arrangement modes may achieve good display effect.

For example, the brightness compensation sub-pixel X is a white sub-pixel, and the chromaticity compensation sub-pixel Y is a yellow sub-pixel or a cyan sub-pixel. The above kinds of the sub-pixels may play a role of display compensation, the yellow sub-pixel may be used for improving the color gamut of the display panel, and the cyan sub-pixel may compensate the blue color. Of course, the brightness and chromaticity compensation sub-pixels may be any other colors in the visible range, as long as the compensation sub-pixels play the role of corresponding compensation.

Each sub-pixel in the display panel may independently emit light with required color and brightness. Generally, the sub-pixels are controlled by a thin-film transistor array (active drive array), each sub-pixel corresponds to at least one thin-film transistor (for an organic light emitting diode display device, each sub-pixel corresponds to a plurality of thin-film transistors), and the thin-film transistors are arranged to form an array and controlled by gate lines and data lines. As shown in FIG. 4, the center sub-pixel in the embodiment traverses two rows, and the center sub-pixel is controlled by only one thin film transistor. Compared with the design of conventional display panel, one thin film transistor is omitted at the position of the center sub-pixel of the embodiment.

In some embodiments, the display panel may be an organic light emitting diode display panel, in which the sub-pixel comprises a light emitting unit, and the colors of light emitted by the light emitting units of the sub-pixels correspond to the colors of the three color sub-pixels and the two compensation sub-pixels.

That is to say, the display panel of this embodiment may be an organic light emitting diode display panel, in which an organic light emitting diode (light emitting unit) is provided at each sub-pixel, the organic light emitting diodes may emit light with different colors (which may be realized by using different organic light emitting layers), and the color of light emitted by each organic light emitting diode is the same as that of the sub-pixel where the organic light emitting diode is located, e.g. the organic light emitting diode at the red sub-pixel emits red light.

In other embodiments, the display panel may also be a liquid crystal display panel, in which the sub-pixel comprises a filter unit, and the colors of light penetrating through the filter units of the sub-pixels correspond to the colors of three color sub-pixels and two compensation sub-pixels.

That is to say, the display panel of this embodiment may also be a liquid crystal display panel, the liquid crystal display panel itself does not emit light, and light emitted from a back light source is filtered to realize display, wherein a color filter membrane (filter unit) with different color is arranged at each sub-pixel, light penetrating through the color filter membrane may be converted to the corresponding color, and the color of the color filter membrane at each sub-pixel is the same as the color of the sub-pixel, e.g. the color filter membrane at the red sub-pixel is red, etc.

Certainly, other types of display panels are also feasible, as long as light with corresponding colors are emitted at the sub-pixels, and the different types of display panels may adopt known structures and therefore are no longer described in detail herein.

The embodiment of the present invention further provides a display device, comprising the above-mentioned display panel.

Moreover, the embodiment of the present invention further provides a display method of the above-mentioned display panel, comprising the following steps: displaying a required color component of red, green or blue at each sub-pixel position, wherein this step comprises causing a plurality of color sub-pixels with the same color near a sub-pixel position to display, so that the required color component is displayed at the sub-pixel position under the average effect of the color sub-pixels with the same color; and performing display compensation on each sub-pixel position, wherein this step comprises performing display compensation on a sub-pixel position by using a plurality of compensation sub-pixels with a required color near the sub-pixel position.

In the display method, the above two steps indicate two operations in the display process and are used for displaying the components of red, green and blue and performing display compensation, respectively, and thus the two steps unnecessarily involve a precedence relationship in time sequence.

It can be seen that, in the display method of the embodiment, any of all required color components of red, green and blue may be displayed (i.e., red, green or blue color component may be displayed) at each sub-pixel position (rather than each sub-pixel), and each color component of each sub-pixel position is displayed by a plurality of color sub-pixels with the corresponding color near the sub-pixel position together, so that the required color component is displayed at the sub-pixel position under the average effect of the color sub-pixels. Meanwhile, in the embodiment, display compensation (brightness compensation and/or chromaticity compensation) is performed on each sub-pixel position by using the compensation sub-pixels so as to improve the display effect, and each sub-pixel position is compensated by a plurality of the compensation sub-pixels near the sub-pixel position.

The display method of the embodiment has the following advantages: 1, any of all color components may be displayed at each sub-pixel position (e.g. a blue component may be displayed at a red sub-pixel position by blue sub-pixels B near the red sub-pixel position), i.e., a complete content may be displayed at each sub-pixel position, and each sub-pixel position is equivalent to one "pixel", so that the resolution on the visual effect is greatly improved; 2, the brightness compensation and the chromaticity compensation may be performed at each sub-pixel position, so that a good display effect is achieved by the two kinds of display compensation; 3, the content displayed (compensated) at each sub-pixel position is an average result of a plurality of sub-pixels near the sub-pixel position, so the displayed color is uniform and soft and the display effect is good; and 4, each sub-pixel position is used as a reference for displaying in the display method of this embodiment, and the contents to be displayed by the sub-pixels near the sub-pixel position are correspondingly calculated, so that the content to be displayed by each sub-pixel may be directly calculated, complex calculation of "layer and region divisions" is not needed, the calculation quantity is small, and the method is easy to be implemented.

In the display method of the embodiment, for example, when a color component identical to the sub-pixel color of a sub-pixel position needs to be displayed at the sub-pixel position (e.g. a red component needs to be displayed at the red sub-pixel position), the plurality of color sub-pixels with the same color near the sub-pixel position include a color sub-pixel (the red sub-pixel R) at the sub-pixel position and a plurality of color sub-pixels (red sub-pixels R) with the color around the sub-pixel position.

In addition, when a color component different from the sub-pixel color of a sub-pixel position needs to be displayed at the sub-pixel position (e.g. a green component needs to be displayed at the red sub-pixel position), the plurality of color sub-pixels with the same color near the sub-pixel position include a plurality of color sub-pixels with a required color (green sub-pixels G) around the sub-pixel position. That is to say, the "the color sub-pixels near the sub-pixel position" do not include the sub-pixel at the sub-pixel position (due to different color).

According to different requirements, the selection method of "the color sub-pixels near the sub-pixel position" is diverse.

Figures 5, 6:
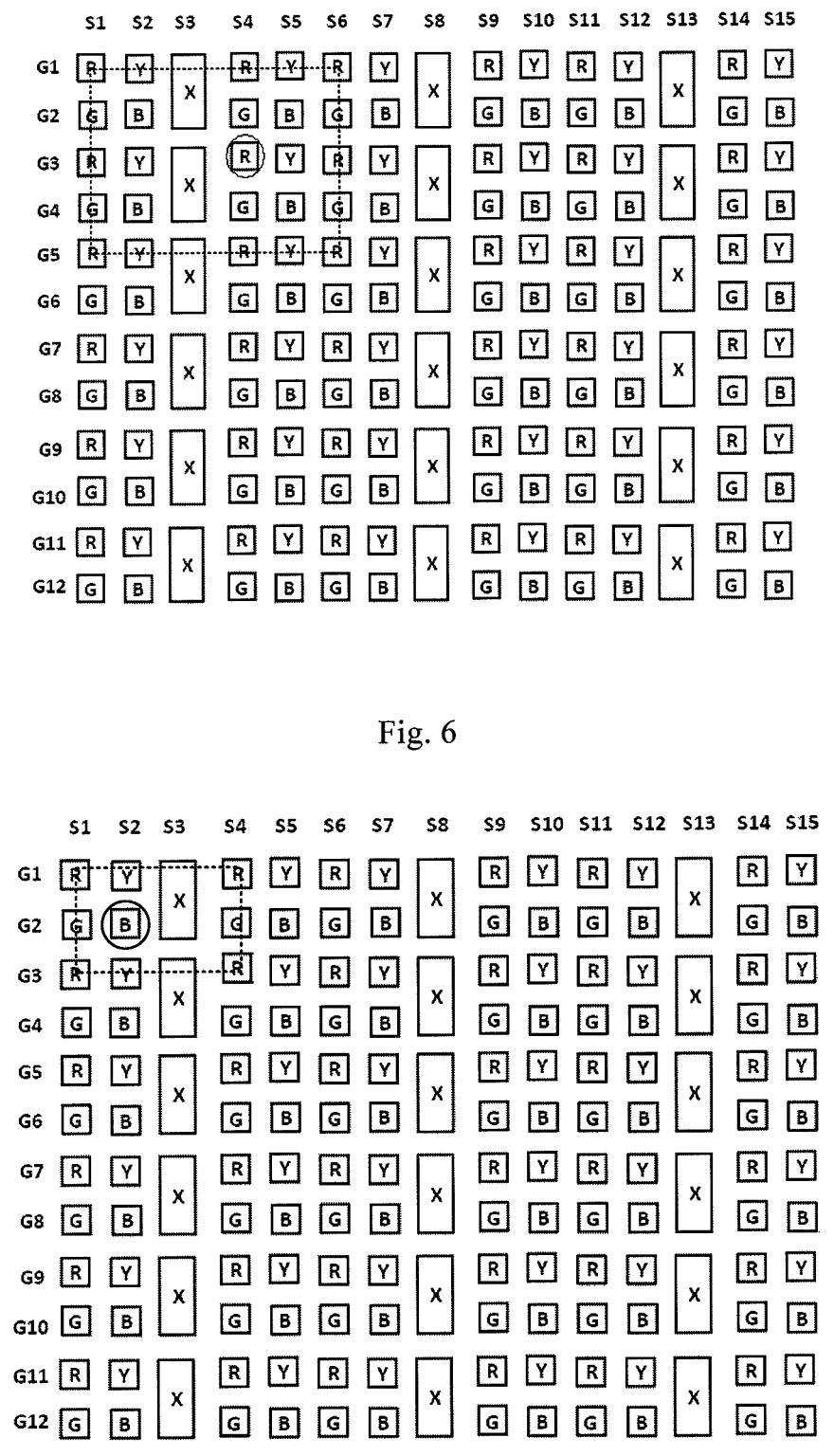

For example, as shown in FIG. 5, when a color component identical to the sub-pixel color of a sub-pixel position needs to be displayed at the sub-pixel position, the plurality of color sub-pixels with the color around the sub-pixel position include two color sub-pixels with the color in the column of the sub-pixel position and closest to the sub-pixel position, and six color sub-pixels with the color respectively in columns on two sides of the column of the sub-pixel position and closest to the sub-pixel position.

That is to say, as shown in FIG. 5, when a red component needs to be displayed at the circled red sub-pixel position with coordinate (S4, G3) in the figure, the red component is displayed by a plurality of color sub-pixels with the color (i.e. the red sub-pixels) around the red sub-pixel position besides the red sub-pixel position itself. The "color sub-pixels with the color around the sub-pixel position" include two red sub-pixels R in the same column as the red sub-pixel position and closest to red blue sub-pixel position, and six red sub-pixels R respectively in the columns on two sides of the column of the sub-pixel position and closest to the sub-pixel position. That is, the "color sub-pixels with the color around the sub-pixel position" may include eight red sub-pixels R connected by dotted lines in the figure, i.e., eight red sub-pixels R with coordinates (S1, G1), (S1, G3), (S1, G5), (S4, G1), (S4, G5), (S6, G1), (S6, G3) and (S6, G5). These "color sub-pixels with the color around the sub-pixel position" constitute a "rectangle" surrounding the sub-pixel position.

In addition, when a color component different from the sub-pixel color of a sub-pixel position needs to be displayed at the sub-pixel position, the plurality of color sub-pixels with a required color around the sub-pixel position includes four color sub-pixels with the required color in columns on two sides of the column of the sub-pixel position and closest to the sub-pixel position.

That is to say, as shown in FIG. 6, when a red component needs to be displayed at the circled blue sub-pixel position with coordinate (S2, G2) in the figure, the "color sub-pixels with the required color around the sub-pixel position" include four red sub-pixels R respectively in the columns on two sides of the column of the blue sub-pixel B and closest to the sub-pixel position, i.e., the red sub-pixels R with coordinates (S1, G1), (S4, G1), (S1, G3) and (S4, G3). It can be seen that, when the above condition is satisfied, the four "color sub-pixels with the required color around the sub-pixel position" definitely constitute a "rectangle".

Figures 7, 8:
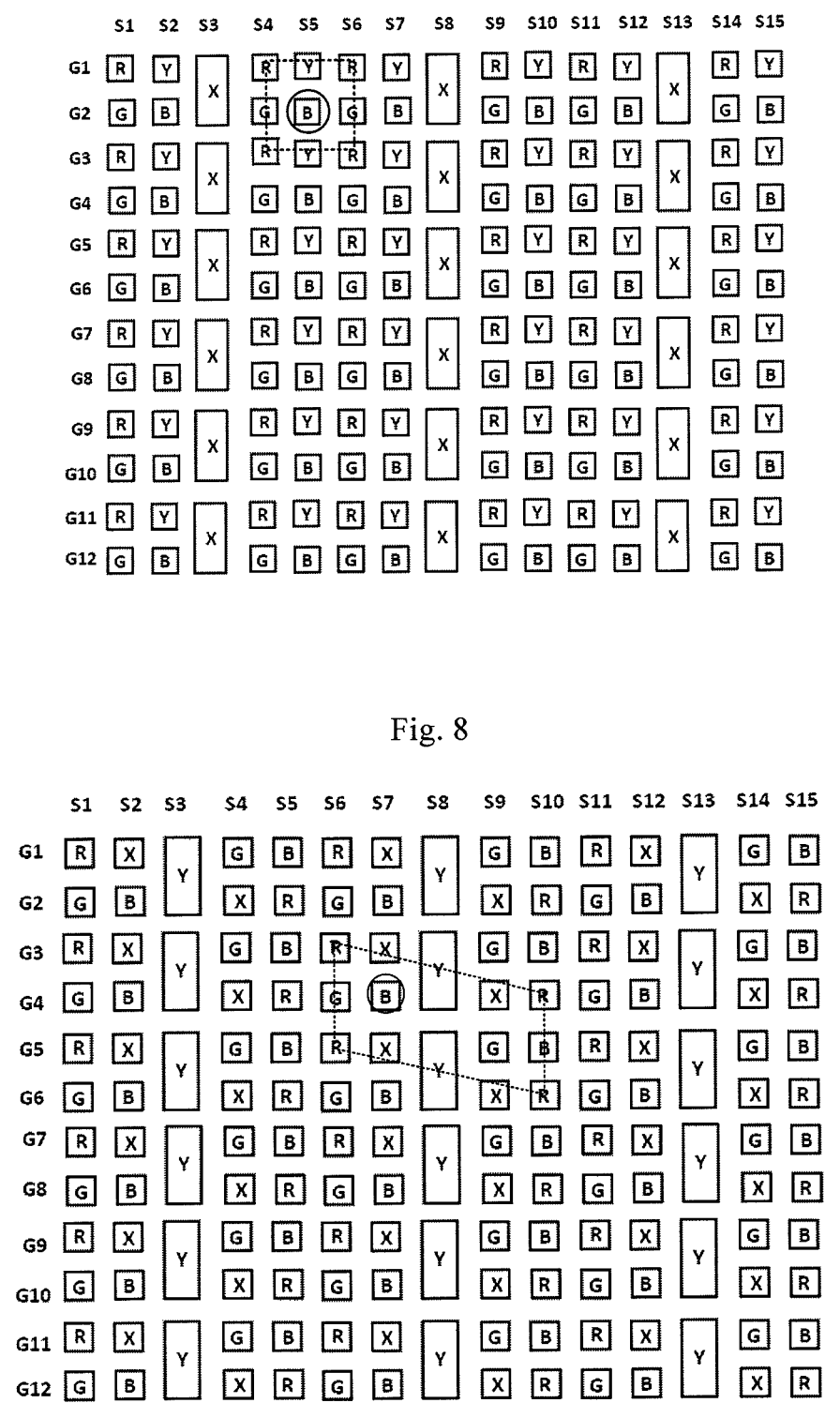

In addition, as shown in FIG. 7, when a red component needs to be displayed at the circled blue sub-pixel position with coordinate (S5, G2) in the figure, the "color sub-pixels with the required color around the sub-pixel position" include four color sub-pixels with the required color respectively in the columns on two sides of the column of the sub-pixel position and closest to the sub-pixel position, i.e., the red sub-pixels R with coordinates (S4, G1), (S6, G1), (S4, G3) and (S6, G3). It can be seen that, when the above condition is satisfied, the four "color sub-pixels with the required color around the sub-pixel position" definitely constitute a "rectangle" or a "square".

In addition, as shown in FIG. 8, when a red component needs to be displayed at the circled blue sub-pixel position with coordinate (S7, G4) in the figure, the "color sub-pixels with the required color around the sub-pixel position" include the red sub-pixels R respectively in the columns on two sides of the column of the blue sub-pixel position and closest to the blue sub-pixel position in the row direction, i.e., the red sub-pixels R with coordinates (S6, G3), (S6, G5), (S10, G4) and (S10, G6). It can be seen that, when the above condition is satisfied, the four "color sub-pixels with the required color around the sub-pixel position" definitely constitute a "parallelogram".

It should be noted that, the sub-pixel arrangements of the "square" and the "rectangle" constituted by the above four "color sub-pixels with the required color around the sub-pixel position" are different in the pixel units in the display panel. The sub-pixel arrangements of the "parallelogram" constituted by the above four "color sub-pixels with the required color around the sub-pixel position" are different from the sub-pixel arrangements of the "square" and the "rectangle" constituted by the above four "color sub-pixels with the required color around the sub-pixel position" in the pixel units in the display panel. It should be understood that, the different figures constituted by the above four "color sub-pixels with the required color around the sub-pixel position" only relate to the sub-pixel arrangements in the pixel units in the display panel, while the principles of the substantive display method thereof are the same.

Figures 9, 10:
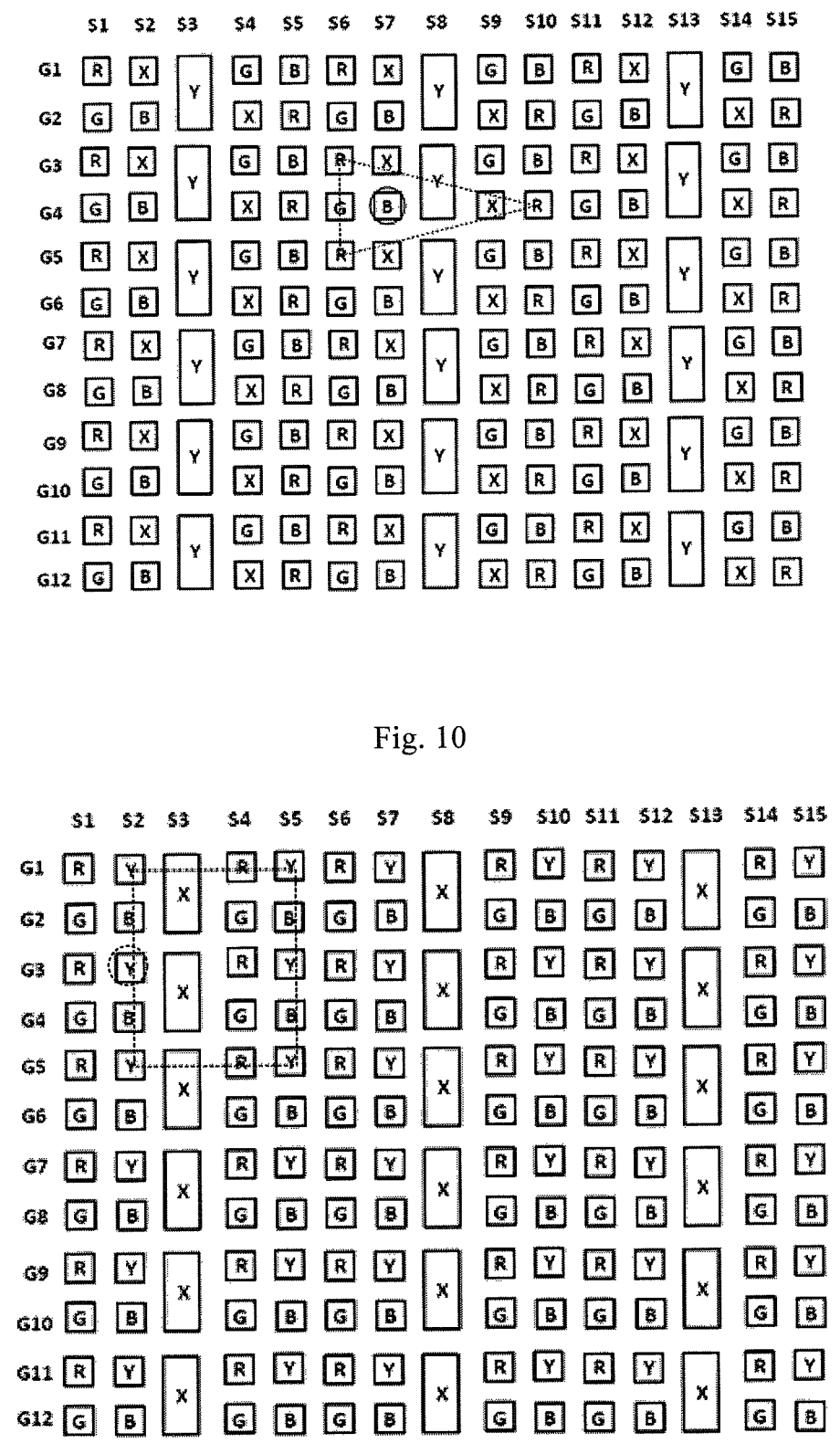

In addition, as shown in FIG. 9, when a color component different from the sub-pixel color of a sub-pixel position needs to be displayed at the sub-pixel position, the plurality of color sub-pixels with a required color around the sub-pixel position include one color sub-pixel with the required color in the same row as the sub-pixel position and in a column having an interval of two columns to the column of the sub-pixel position in the row direction, and two color sub-pixels with the required color in two rows adjacent to the row of the sub-pixel position and closest to the sub-pixel position in the row direction.

That is, as shown in FIG. 9, when a red component needs to be displayed at the circled blue sub-pixel position with coordinate (S7, G4) in the figure, the "color sub-pixels with the required color around the sub-pixel position" include one red sub-pixel R in the same row as the blue sub-pixel position and in a column having an interval of two columns to the column of the blue sub-pixel position in the row direction, and two red sub-pixels R in two rows adjacent to the row of the blue sub-pixel position and closest to the blue sub-pixel position in the row direction, i.e., the red sub-pixels R with coordinates (S6, G3), (S6, G5) and (S10, G4).

It can be seen that, when the above condition is satisfied, the three "color sub-pixels with the required color around the sub-pixel position" definitely constitute an "isosceles triangle".

The above selection method of the "color sub-pixels around the sub-pixel position" may ensure that the selected color sub-pixels are close to the sub-pixel position and are not too much in number, so that good display effect may be achieved and over large calculation quantity during display may be avoided.

In the display method of the embodiment, for example, when a sub-pixel position needs display compensation and the color of the compensation sub-pixels for compensation is the same as the color of the sub-pixel at the sub-pixel position, the plurality of compensation sub-pixels with the color near the sub-pixel position include a compensation sub-pixel at the sub-pixel position and a plurality of compensation sub-pixels with the color around the sub-pixel position.

In addition, when a sub-pixel position needs display compensation and the color of the compensation sub-pixels for compensation is different from the color of the sub-pixel at the sub-pixel position, the plurality of compensation sub-pixels with the required color near the sub-pixel position include a plurality of compensation sub-pixels with the required color around the sub-pixel position.

That is to say, similar to the condition that the color components are displayed, when display compensation is performed, the selection method of the plurality of compensation sub-pixels with the required color near the sub-pixel position is different according to different types of the sub-pixels at the compensation position, and the plurality of compensation sub-pixels near the sub-pixel position may include the sub-pixel at the sub-pixel position (when the brightness compensation is performed on the brightness compensation sub-pixel position, or the chromaticity compensation is performed on the chromaticity compensation sub-pixel position) or not include the sub-pixel at the sub-pixel position (when the brightness compensation is performed on the color sub-pixel position or the chromaticity compensation sub-pixel position, or when the chromaticity compensation is performed on the color sub-pixel position or the brightness compensation sub-pixel position).

Meanwhile, similar to the condition that the color components are displayed, when display compensation is performed, the selection method of the "compensation sub-pixels around the sub-pixel position" is also diverse.

As shown in FIG. 10, when a sub-pixel position needs display compensation and the color of the compensation sub-pixels for compensation is the same as the color of the sub-pixel at the sub-pixel position, the plurality of compensation sub-pixels around the sub-pixel position include two compensation sub-pixels with the color in the column of the sub-pixel position, on upper and lower sides of the row of the sub-pixel position and closest to the sub-pixel position, and three compensation sub-pixels with the color in a column on a side of the column of the sub-pixel position and closest to the sub-pixel position.

That is to say, as shown in FIG. 10, when compensation having the same type as a compensation sub-pixel at a compensation sub-pixel position is performed on the compensation sub-pixel position, e.g., when the chromaticity compensation is performed on the circled chromaticity compensation sub-pixel position with coordinate (S2, G3) in the figure, the "compensation sub-pixels with the color around sub-pixel position" include five chromaticity compensation sub-pixels Y connected by dotted lines in the figure, i.e., five chromaticity compensation sub-pixels Y with coordinates (S2, G1), (S2, G5), (S5, G1), (S5, G3) and (S5, G5).

It should be noted that, the case where the brightness compensation is performed on the brightness compensation sub-pixel X is similar to the above, and detailed description thereto is omitted herein.

Figures 11, 12:
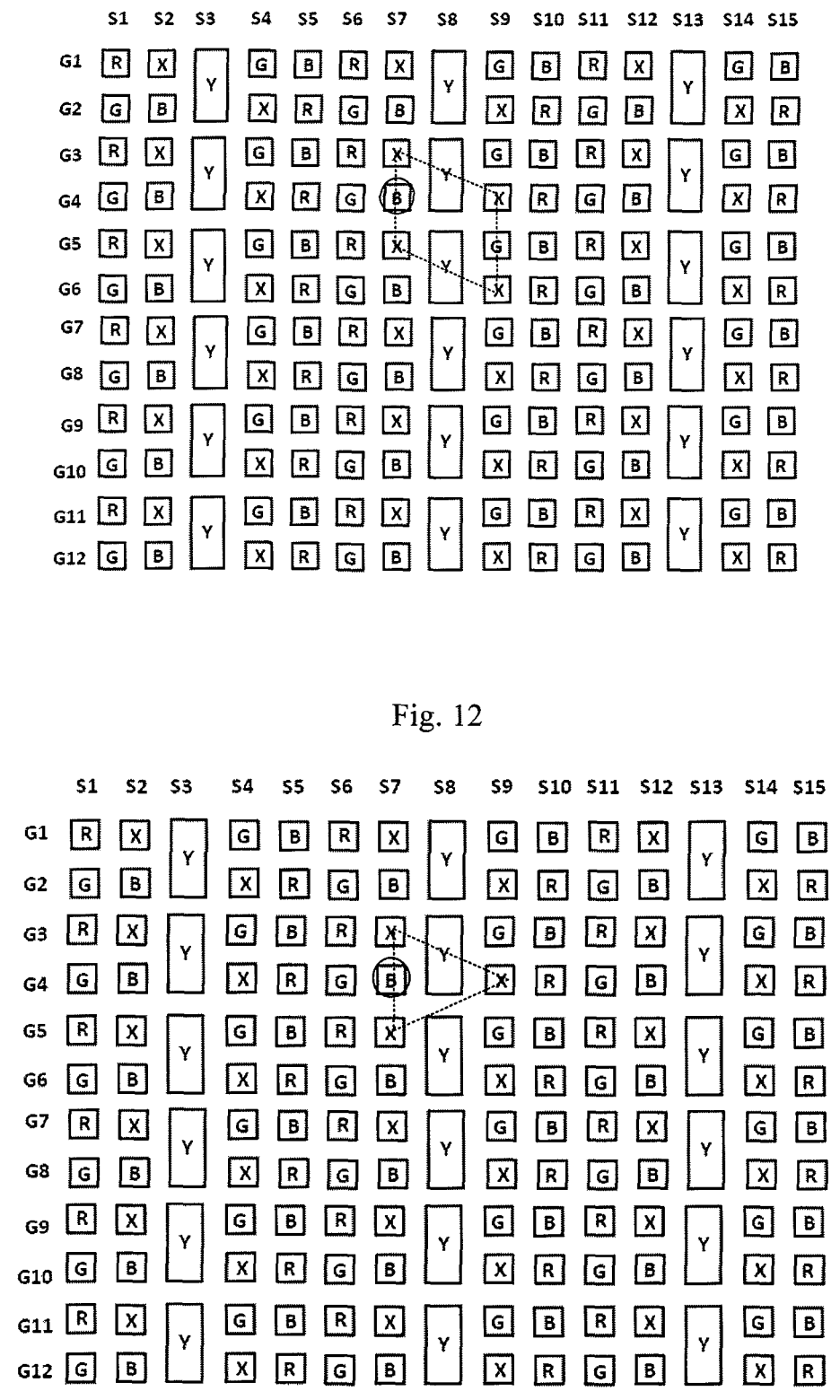

As shown in FIG. 11, when a sub-pixel position needs display compensation and the color of the compensation sub-pixels for compensation is different from the color of the sub-pixel at the sub-pixel position, the plurality of compensation sub-pixels with a required color around the sub-pixel position include two compensation sub-pixels with the required color in the same column as the sub-pixel position and closest to the sub-pixel position, and two compensation sub-pixels with the required color in a column on a side of the column of the sub-pixel position and closest to the sub-pixel position.

That is to say, as shown in FIG. 11, when a sub-pixel position is compensated in different type from the sub-pixel at the sub-pixel position, for example, when the brightness compensation is performed on the circled blue sub-pixel position with coordinate (S7, G4) in the figure, the "compensation sub-pixels with the required color around the sub-pixel position" may include four brightness compensation sub-pixels X constituting a "parallelogram" and connected by dotted lines in the figure, i.e., four brightness compensation sub-pixels X with coordinates (S7, G3), (S7, G5), (S9, G4) and (S9, G6).

It should be noted that, the case where the brightness compensation is performed on the color sub-pixel position with other color or the chromaticity compensation sub-pixel position, or the chromaticity compensation is performed on the color sub-pixel position or the brightness compensation sub-pixel position is similar to the above, and detailed description thereto is omitted herein.

In addition, as shown in FIG. 12, when a sub-pixel position needs display compensation and the color of the compensation sub-pixels for compensation is different from the color of the sub-pixel at the sub-pixel position, the plurality of compensation sub-pixels with a required color around the sub-pixel position include two compensation sub-pixels with the required color in the same column as the sub-pixel position, on upper and lower sides of the sub-pixel position and closest to the sub-pixel position, and one compensation sub-pixel with the required color in a column on a side of the column of the sub-pixel position and in the same row as the sub-pixel position and closest to the sub-pixel position.

That is to say, as shown in FIG. 12, when a sub-pixel position is compensated in different type from the sub-pixel at the sub-pixel position, for example, when the brightness compensation is performed on the circled blue sub-pixel position with coordinate (S7, G4) in the figure, the "compensation sub-pixels with the required color around the sub-pixel position" may include three brightness compensation sub-pixels X constituting a "isosceles triangle" and connected by dotted lines in the figure, i.e., three brightness compensation sub-pixels X with coordinates (S7, G3), (S7, G5), and (S9, G4).

It should be noted that, the case where the brightness compensation is performed on the color sub-pixel position with other color or the chromaticity compensation sub-pixel position, or the chromaticity compensation is performed on the color sub-pixel position or the brightness compensation sub-pixel position is similar to the above, and detailed description thereto is omitted herein.

It should be understood that, in the embodiment, the content of each sub-pixel position is displayed (compensated) by a plurality of sub-pixels together, and accordingly, each sub-pixel is not only used for display at a position, but also used for displays at a plurality of sub-pixel positions. For example, as shown in FIG. 6, the red sub-pixel R with coordinate (S4, 01) is at work when a red component needs to be displayed at the sub-pixel position with coordinate (S2, G2) and is also at work when a red component needs to be displayed at the sub-pixel position with coordinate (S5, G2). Therefore, the content to be displayed by any one of sub-pixels is determined together by the contents to be displayed by a plurality of sub-pixel positions corresponding to the sub-pixel.

It should be understood that, the selection method of the "color (compensation) sub-pixels around the sub-pixel position" above may be changed at any time according to the specific displayed contents. For example, in different frames of pictures, "the color (compensation) sub-pixels around the sub-pixel position" used when the same color is displayed at the same sub-pixel position may be different (e.g. three sub-pixels are used in the first frame of picture, and four sub-pixels are used in the second frame of picture). Further, in a frame of picture, the selection methods of the "color (compensation) sub-pixels around the sub-pixel position" for different sub-pixel positions may also be different.

It should be understood that, when the "color (compensation) sub-pixels around the sub-pixel position" are determined, the selection methods of the "color (compensation) sub-pixels around the sub-pixel position" for the sub-pixel positions close to the edges of the display panel may be different from above. For example, there is no other sub-pixel above the top row of sub-pixel positions of the display panel, so only the sub-pixels below the top row of sub-pixel positions may be used as the "color (compensation) sub-pixels around the sub-pixel position".

It could be understood that, the above implementation ways are merely exemplary embodiments adopted for describing the principle of the present invention, but the present invention is not limited thereto. Various modifications and improvements may be made by those of ordinary skill in the art without departing from the spirit and essence of the present invention, and these modifications and improvements are contemplated as within the protection scope of the present invention.

The invention claimed is:

1. A display method of a display panel, the display panel comprising a plurality of pixel units, wherein each pixel unit is composed of nine sub-pixels arranged in five columns, the nine sub-pixels include a single center sub-pixel traversing two rows and only provided in the third column of each pixel unit, and eight normal sub-pixels arranged in two rows in other columns; two normal sub-pixels in each column of each pixel unit are spaced apart from each other; the nine sub-pixels in each pixel unit include color sub-pixels and compensation sub-pixels, the color sub-pixels include a red sub-pixel, a green sub-pixel and a blue sub-pixel, and the compensation sub-pixels include a brightness compensation sub-pixel and a chromaticity compensation sub-pixel; and the center sub-pixel has any one of five kinds of colors, a number of the sub-pixels with each of other four colors is two, and the sub-pixels with a same color are not adjacent to each other, the display method comprises steps of:
displaying a required color component at each sub-pixel position, wherein this step comprises, for each sub-pixel position, causing a plurality of color sub-pixels with the same color near said each sub-pixel position to display so that the required color component is displayed at said each sub-pixel position under an average effect of the color sub-pixels with the same color near said each sub-pixel position, the required color component is any of red, green and blue, wherein when a color component identical to the sub-pixel color of said each sub-pixel position needs to be displayed at said each sub-pixel position, the plurality of color sub-pixels with the same color near said each sub-pixel position include a color sub-pixel at said each sub-pixel position and a plurality of color sub-pixels with the color around said each sub-pixel position, and when a color component different from the sub-pixel color of said each sub-pixel position needs to be displayed at said each sub-pixel position, the plurality of color sub-pixels with the same color near said each sub-pixel position include a plurality of color sub-pixels with a required color around said each sub-pixel position; and performing display compensation on each sub-pixel position, wherein this step comprises, for each sub-pixel position, performing display compensation on said each sub-pixel position by using a plurality of compensation sub-pixels with a required color near said each sub-pixel position.

2. The display method of claim 1, wherein
when a color component identical to the sub-pixel color of said each sub-pixel position needs to be displayed at said each sub-pixel position, the plurality of color sub-pixels with the color around said each sub-pixel position include:
two color sub-pixels with the color in the column of said each sub-pixel position and closest to said each sub-pixel position; and
six color sub-pixels with the color respectively in columns on two sides of the column of said each sub-pixel position and closest to said each sub-pixel position.

3. The display method of claim 1, wherein when a color component different from the sub-pixel color of said each sub-pixel position needs to be displayed at said each sub-pixel position, the plurality of color sub-pixels with a required color around said each sub-pixel position include:
four color sub-pixels with the required color in columns on two sides of the column of said each sub-pixel position and closest to said each sub-pixel position.

4. The display method of claim 1, wherein when a color component different from the sub-pixel color of said each sub-pixel position needs to be displayed at said each sub-pixel position, the plurality of color sub-pixels with a required color around said each sub-pixel position include:
one color sub-pixel with the required color in the same row as said each sub-pixel position and in a column having an interval of two columns to the column of said each sub-pixel position in the row direction; and
two color sub-pixels with the required color in two rows adjacent to the row of said each sub-pixel position and closest to said each sub-pixel position in the row direction.

5. The display method of claim 1, wherein, in the step of performing display compensation on each sub-pixel position, for each sub-pixel position:
when said each sub-pixel position needs display compensation and the compensation sub-pixels for compensation have a color the same as that of the sub-pixel at said each sub-pixel position, the plurality of compensation sub-pixels with a required color near said each sub-pixel position include a compensation sub-pixel at said each sub-pixel position and a plurality of compensation sub-pixels with the color around said each sub-pixel position; and when a sub-pixel position needs display compensation and the compensation sub-pixels for compensation have a color different from that of the sub-pixel at said each sub-pixel position, the plurality of compensation sub-pixels with a required color near said each sub-pixel position include a plurality of compensation sub-pixels with the required color around said each sub-pixel position.

6. The display method of claim 5, wherein when said each sub-pixel position needs display compensation and the color of the compensation sub-pixels for compensation is the same as the color of the sub-pixel at said each sub-pixel position, the plurality of compensation sub-pixels with the color around said each sub-pixel position include:

two compensation sub-pixels with the color in the column of said each sub-pixel position, on upper and lower sides of the row of said each sub-pixel position and closest to said each sub-pixel position; and three compensation sub-pixels with the color in a column on a side of the column of said each sub-pixel position and closest to said each sub-pixel position.

7. The display method of claim 5, wherein when said each sub-pixel position needs display compensation and the color of the compensation sub-pixels for compensation is different from the color of the sub-pixel at said each sub-pixel position, the plurality of compensation sub-pixels with the required color around said each sub-pixel position include:

two compensation sub-pixels with the required color in the same column as said each sub-pixel position and closest to said each sub-pixel position; and two compensation sub-pixels with the required color in a column on a side of the column of said each sub-pixel position and closest to said each sub-pixel position.

8. The display method of claim 5, wherein when said each sub-pixel position needs display compensation and the color of the compensation sub-pixels for compensation is different from the color of the sub-pixel at said each sub-pixel position, the plurality of compensation sub-pixels with the required color around said each sub-pixel position include:

two compensation sub-pixels with the required color in the same column as said each sub-pixel position and closest to said each sub-pixel position; and one compensation sub-pixel with the required color in a column on a side of the column of said each sub-pixel position, in the same row as said each sub-pixel position and closest to said each sub-pixel position.

* * * * *